(12) United States Patent
Hooker et al.

(10) Patent No.: US 10,431,704 B2
(45) Date of Patent: Oct. 1, 2019

(54) METHOD FOR PRODUCING A UV PHOTODETECTOR

(71) Applicant: MERCK PATENT GMBH, Darmstadt (DE)

(72) Inventors: Rebekah Hooker, Belmont, MA (US); Deepak Ranjan Deshmukh, Watertown, MA (US); Pawel Miskiewicz, Southampton (GB); Andreas Klyszcz, Darmstadt (DE); Klaus Bonrad, Alsbach-Haehnlein (DE); Thomas Albrecht, Frankfurt am Main (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 15/115,831

(22) PCT Filed: Jan. 16, 2015

(86) PCT No.: PCT/EP2015/000073
§ 371 (c)(1),
(2) Date: Aug. 1, 2016

(87) PCT Pub. No.: WO2015/113737
PCT Pub. Date: Aug. 6, 2015

(65) Prior Publication Data
US 2017/0170345 A1    Jun. 15, 2017

Related U.S. Application Data

(60) Provisional application No. 61/934,102, filed on Jan. 31, 2014.

(51) Int. Cl.
*H01L 31/032*    (2006.01)
*H01L 21/02*    (2006.01)
(Continued)

(52) U.S. Cl.
CPC ............ *H01L 31/032* (2013.01); *C23C 16/44* (2013.01); *C23C 18/1216* (2013.01);
(Continued)

(58) Field of Classification Search
CPC ....... H01L 31/032; H01L 31/18; H01L 31/09; C23C 16/44
See application file for complete search history.

(56) References Cited

U.S. PATENT DOCUMENTS

| 7,432,577 B1 | 10/2008 | Weiss et al. |
| 8,766,251 B2 | 7/2014 | Kuegler et al. |

(Continued)

FOREIGN PATENT DOCUMENTS

| CN | 102272094 A | 12/2011 |
| CN | 102460641 A | 5/2012 |

(Continued)

OTHER PUBLICATIONS

International Search Report for PCT/EP2015/000073 dated Apr. 14, 2015.

(Continued)

*Primary Examiner* — Thanh T Nguyen
(74) *Attorney, Agent, or Firm* — Millen White Zelano and Branigan, PC; John Sopp

(57) ABSTRACT

This invention relates to a method for producing a photodetector based on the deposition of precursor system having a liquid phase. The photodetectors are characterized by a certain group of semiconductor materials which can be used as the absorber in solar-blind UV detectors. A facile route for the formation of thin layers of such absorber materials is disclosed.

7 Claims, 3 Drawing Sheets

(51) Int. Cl.
  *H01L 51/00* (2006.01)
  *C23C 18/12* (2006.01)
  *H01L 31/09* (2006.01)
  *C23C 16/44* (2006.01)
  *H01L 31/18* (2006.01)

(52) U.S. Cl.
  CPC ...... *C23C 18/1279* (2013.01); *H01L 21/0242* (2013.01); *H01L 21/02554* (2013.01); *H01L 21/02565* (2013.01); *H01L 21/02628* (2013.01); *H01L 31/09* (2013.01); *H01L 31/18* (2013.01); *H01L 51/0004* (2013.01); *Y02E 10/549* (2013.01); *Y02P 70/521* (2015.11)

(56) References Cited

U.S. PATENT DOCUMENTS

| | | | |
|---|---|---|---|
| 9,117,964 | B2 | 8/2015 | Deshmukh et al. |
| 9,129,801 | B2 | 9/2015 | Fleischhaker et al. |
| 2011/0272691 | A1* | 11/2011 | Kuegler ............... C07C 249/08 257/43 |
| 2012/0086002 | A1* | 4/2012 | Fleischhaker ..... H01L 21/02422 257/43 |
| 2013/0102108 | A1* | 4/2013 | Deshmukh .......... C23C 18/1204 438/95 |
| 2014/0284598 | A1* | 9/2014 | Boutwell .............. H01L 31/032 257/43 |
| 2014/0367676 | A1 | 12/2014 | Haeming et al. |

FOREIGN PATENT DOCUMENTS

| | | |
|---|---|---|
| DE | 19951207 A1 | 4/2001 |
| DE | 102009004491 A1 | 7/2010 |
| DE | 102012009045 A1 | 10/2013 |
| JP | 04-367540 A | 12/1992 |
| WO | 2010078907 A1 | 7/2010 |
| WO | 2010146053 A1 | 12/2010 |
| WO | 2012000594 A1 | 1/2012 |
| WO | 2013110434 A1 | 8/2013 |

OTHER PUBLICATIONS

English Abstract of DE102012009045, Publication Date: Nov. 7, 2013.
Office Action for related Chinese Patent Application No. 201580006138.5 dated Feb. 24, 2018.
Guo Yubin et al., "Optical fiber communication technology," Edited Xidian University Press, Sep. 30, 2008.
Office Action for related JP Patent Application No. 2016-549446 dated Jan. 30, 2019 (1 page).

* cited by examiner

METHOD FOR PRODUCING A UV PHOTODETECTOR

This invention relates to a method for producing a photodetector based on the deposition of a precursor system having a liquid phase. The photodetectors are characterized by a certain group of semiconductor materials which can be used as the absorber in solar-blind UV detectors. A facile route for the formation of thin layers of such absorber materials is disclosed.

BACKGROUND

Photodetectors are broadly defined as devices which respond to incident electromagnetic radiation, thereby enabling measurement of the intensity of the incident radiation. A photodetector typically includes some sort of photoconductive device and external measurement circuitry.

The detection of ultraviolet (UV) light under daylight conditions is an important problem for commercial (household and professional) and defence applications. Photodetectors with sensitivity in the UV have wide applicability. Exposure to UV-A and UV-B radiation (320-400 nm and 280-320 nm, respectively) can lead to skin cancer, making quantification of UV-A and UV-B light important for health reasons. Detection in the UV-C range (from 200-280 nm), which is termed "deep UV" (DUV), is important in solar radiometry, scientific research (such as in scintillation detectors), environmental studies, and biological research. UV-C photosensors have commercial application in fire alarms, combustion monitoring, missile plume detection, and space-to-space transmissions (Peng et al., Adv. Mater. 2013, doi: 10.100$^2$/adma.201301802). In contrast to UV-A and UV-B light, UV-C light from the sun is completely absorbed by the earth's atmosphere and therefore does not interfere with DUV reporting.

A particular challenge is the design of "solar blind" detectors that are sensitive to very low levels of UV-C radiation and insensitive to visible light. Since the solar spectrum ceases at about a wavelength $\lambda$ of 290 nm, a solar-blind detector shall be defined as a device or apparatus that only responds to wavelengths below 285 nm.

A variety of fabrication routes for UV photodetectors have been explored, ranging from vacuum-based methods such as epitaxial growth of thin films and vapor deposition of nanowires to solution-processing, in the form of sol-gels, nanocolloidal inks, and spray pyrolysis. $Ga_2O_3$, for example, can be made using sputtering, chemical vapor deposition, CVD, pulsed laser deposition, spray pyrolysis, and sol-gel methods (Appl. Phys. Lett. 90, 031912, 2007). Each approach boasts certain achievements, but also presents challenges.

One group of devices are the UV photodetectors based on single crystalline absorbers. Narrow bandgap materials such as silicon and III-V compounds may be used for UV photodetection; however, their spectral range must be modified through the use of high-pass optical filters or by the incorporation of phosphors. To further reduce the dark current, such devices are typically cooled during operation. Over the long-term, exposure to irradiation of higher energy the band-gap may damage the active material (Peng et al., Adv. Mater. 2013, 35, 5321-5328).

To avoid these issues, epitaxial growth of wide band-gap semiconductors with intrinsic "visible blindness" have been explored for use in UV photodetectors. Photodetectors based on crystalline $Mg_xZn_{1-x}O$ (4.76 eV, bandgaps provided in brackets), InGeO and ZnGeO (4.43 and 4.68 eV), β-$Ga_2O_3$ (4.8 eV), $Al_xGa_{1-x}N$ (>3.4 eV), AlN, BN, and diamond have been reported. A challenge of this approach lies in growing high quality, lattice-matched films on low-cost substrates. Often, the resulting material suffers from a large density of dislocations and grain boundaries. The photoconductivity depends on stoichiometry and, in the case of the metal oxides, on gas absorption phenomena. However, the ability to tune the bandgap through doping is limited by the tolerance of the crystal lattice. Many polycrystalline films exhibit slow response times ranging from a few minutes to several hours (Jin et al., Nano Lett., Vol. 8, No. 6, 2008).

Another group of devices are the UV photodetectors based on nanostructured crystalline absorbers. In this area, two different approaches can in principle be used, in which inks contain either molecular precursors that decompose to form the target material, or preformed, crystalline nanoparticles.

Nanostructured UV photodetectors may have advantages compared to those based on bulk materials. Carrier confinement can lead to higher responsivity and increased photoconductivity gains. For metal oxides, the high surface area to volume ratio facilitates gas adsorption and desorption, which may suppress the dark current (Peng et al., Adv. Mater. 2013, 35, 5321-5328).

Nanowires of a number of binary and ternary metal oxides have been incorporated into such UV photosensors, including $Nb_2O_5$ nanobelts for UV-A sensing (Adv. Funct. Mater. 2011, 21, 3907-3915) and $Zn_2GeO_4$ and $In_2Ge_2O_7$ nanowires (J. Mater. Chem. C, 2013, 1, 131-137). Devices based on bridged assemblies of ZnO or $Ga_2O_3$ nanowires can be fabricated in a single chemical vapour deposition step (Li et al., Adv. Funct. Mater. 2010, 20, 3972). Devices based on a single $Ga_2O_3$ nanobelt grown using chemical vapor deposition exhibited high selectivity towards 250 nm light, fast response times of less than 0.3 s, and a S/N ratio greater than 4 orders of magnitude (Li et al., Nanoscale, 2011, 3, 1120).

High performing UV photodetectors have also been demonstrated based on inks comprised of pre-formed crystalline nanostructures. Jin et al. describe (Nano Lett., Vol. 8, No. 6, 2008) the fabrication of a solution-processed photodetector through spin-coating colloidal ZnO nanoparticles and annealing the thin film in air. The devices exhibit high UV photocurrent efficiencies with a responsivity of 61 A/W of 370 nm light and low dark currents with a resistance >1 TΩ. Notably, the response time for these materials is quite rapid, under 0.1 s and about 1 s for the rise and fall, respectively. Photodetectors active in the near UV have been demonstrated using $In_2O_3$ nanoparticles (Shao et al., App Surface Science 261 (2012) 123)

Precursor Based Approach:

Metal oxides thin films can readily be generated using sol-gels. Comparisons of the sol-gel films to vacuum deposited films indicate that the solution-processed devices may have improved performance (J. Vac. Sci. Technol. B 30, 031206, 2012). By tailoring the annealing conditions after sol-gel deposition, a variety of nanostructures can be accessed, including vertically aligned ZnO NWs (Bai et al., Current Applied Physics 13 (2013) 165e169)

$Ga_2O_3$ deep UV photodetectors have also been reported using sol gel methods. In one case, $Ga_2O_3$ was prepared using gallium isopropoxide as the precursor and methoxyethanol and monoethanolamine as the solvent and stabilizer, respectively. The films were annealed at temperatures ranging from 400-1200° C. A spectral response was observed for films heated to 600° C. and above, with the peak value of the photocurrent increasing with heat-treatment temperature up to 1000° C. (Appl. Phys. Lett. 90, 031912, 2007). In another study, $Ga_2O_3$ devices produced using a sol-gel had high responsivity of over 1 A/W (Appl. Phys. Lett. 98, 131114, 2011). The documents JP 2008282881 a and JP 2009044019 A likewise report such sol-gel approaches for making indium oxide containing films.

Spray pyrolysis is a viable alternative to sol gel processing. Photoconductive detectors based on Ga-doped ZnO deposited through spray pyrolysis at 450° C. have been reported (Shinde and Rajpure, Mat. Res. Bull., 46 (2011) 1734). Under illumination at 365 nm (2 mW/cm$^2$), a current over 2 mA was generated.

$Ga_2O_3$ nanoparticles have also successfully been synthesized using spray pyrolysis of gallium nitrate. In this case, $Ga(NO_3)_3$ was dissolved in ultra pure water and combined with lithium chloride as a flux salt. The resulting solution was atomized and transferred as a mist into an alumina reactor (700-1000° C.) to form $Ga_2O_3$ nanoparticles as a route toward GaN nanoparticles. A photodetector was not fabricated (Ogi et al., Advanced Powder Technology 20 (2009) 29-34). A lower temperature process was reported by Kim and Kim (J. Appl. Phys. 62 (5), 1987), in which $GaCl_3$ was sprayed from aqueous solvent onto a substrate heated to 350° C. While a device was not made in this instance, XRD data matched that of $Ga_2O_3$, and optical measurements indicated a bandgap of 4.23 eV.

A technological need exists for a material platform for UV detectors that is compatible with low-temperature processing and large-area integration. Processing routes are sought which have the potential to lower costs and allow for flexible device architectures. As of yet, a low temperature (<500° C.) route to deep UV photodetectors (responsive below 280 nm) that are truly solar blind is still needed.

SUMMARY OF THE INVENTION

One embodiment of the current invention relates to a method for producing a UV photodetector by deposition of a liquid carrier, one or more metal ions, where one or more of the metal ions is bound to a ligand selected from oximate and hydroxamate, onto a substrate, processing the deposited composition resulting a UV photodetector material, and providing electrodes to the photodetector material.

A further embodiment of the current invention relates to use of a chemical precursor for the production of a UV detector, where the chemical precursor is processed into a UV photodetector material in the UV detector. The chemical precursor is preferably selected from metal oximate precursors and metal hydroxamate precursors.

Still another embodiment of the current invention relates to a composition comprising a liquid carrier and a metal precursor having one or more ligands, where the ligands comprise an oximate or a hydroxamate ligand, preferably characterized in that the metal precursor comprises certain metals mentioned within this disclosure, especially gallium or a mixture of zinc and another metal selected from indium (In), gallium (Ga), aluminium (Al) and magnesium (Mg).

Still another embodiment of the current invention relates to a UV detector made by the inventive process.

The invention also relates to a printed UV photodetector comprising a substrate, a printed layer of metal oxide, and a pair of electrodes connected to the layer of oxide, wherein the electrodes are configured in a manner that incident UV light can be absorbed by the layer of metal oxide between the electrodes.

This invention discloses specifically the use of metal oximate and metal hydroxamate precursors for the generation of metal oxide thin films like IZO and $Ga_2O_3$ thin films suitable for use in deep UV photodetectors.

DETAILED DESCRIPTION

One embodiment of a photodetector made in accordance with the present invention is depicted in FIG. 1. The photodetector includes a device having electrodes (optionally interdigitated) connected to external circuitry. The external circuitry typically comprises a biasing (voltage) source, and a measurement instrument, such as a current meter. In a preferred embodiment the source is a voltage source operating within the range of 5-25 V. The current meter may be any suitably sensitive current meter. In operation, photons (in the form of incident light) strike the active semiconductor surface of device. Photons of suitable wavelength are absorbed and give rise to electron hole pairs. The electrical conductivity of the device increases in proportion to the photon flux (number of photons per second). An external electric field, generated by application of the bias voltage causes the electrons and holes to be transported within the device, thereby giving rise to a current in the external circuitry which is measurable by a current meter. It will be understood by those skilled in the art, however, that a device embodying the detector of the invention will operate without an applied voltage inasmuch as an electrical signal output is generated by the electron hole pairs created by the absorbed photons. Such configuration may be achieved by incorporating the detector into a transistor configuration, wherein the photoactive layer is positioned beneath the gate electrode or in the channel region.

The photodetector active material can be fabricated by depositing the precursor solution onto a substrate and thermally decomposing the precursors to obtain the absorber layer.

The photodetector made according to the process of the current invention provides a high responsiveness to UV irradiation but is blind to visible light. Therefore it is highly suitable for UV detection under daylight conditions. The detector shows a small dark current and hence a high signal-to-noise ratio. The detector shows a very quick temporal response allowing for detection with no delay. The wavelength of peak responsivity can be adjusted by the choice of materials used in the process. The material made from the process is uniform and stable.

The process itself is very economic, since it is scalable, quick and requires little and cheap starting materials. No vacuum and expensive equipment is needed. The process is further characterized by benign process temperatures, since the formation of oxides from the disclosed precursors requires only moderate temperatures. Therefore the process is already suitable for some flexible substrates like thin metal foil and selected polymers with good high temperature strength. Combining the ease of manufacture and temperature behaviour, even a roll-to-roll process is within reach.

All together, photodetector devices with high gain, high spatial and temporal resolution and high sensitivity can be achieved at little cost.

The liquid carrier used in the precursor composition for the inventive process comprises preferably organic solvents, more preferably dimethylformamide (DMF), dimethyl sulfoxide (DMSO), alcohols (e.g. ethanol, butanol, 2-methoxyethanol, diethyleneglycol), N,N, dimethylformamide or mixtures thereof and with other solvents.

The class of oximates according to the current invention is comprised by 2-oximino carboxylic acids, their derivates by variation of the substituents $R^1$ and $R^2$ of the formula A below, and corresponding anions. The oximate stands specifically for the anion, which is at the same time a ligand (oximato ligand) for metals, preferably metal ions. A general structure of a preferred oximato ligand as referred to above and below is of the following formula A:

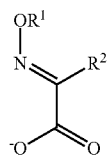

A wherein $R_1$ is selected from H, $CH_3$ or $CH_2CH_3$, and $R_2$ is selected from H, $C_1$ to $C_6$ alkyls, phenyl or benzyl, preferably H, $CH_3$ or $CH_2CH_3$. The oximato ligand usually is a chelate ligand with one negative charge. As a chelate ligand it bonds to the metal via the N and one of the O atoms. It is preferred in accordance with the invention for one or more of the ligands of the metal complex to comprise a 2-(methoxyimino)alkanoate, 2-(ethoxyimino)alkanoate or 2-(hydroxyimino)alkanoate, more preferably the ethanoate, propanoate or butanoate within ($C_2$- to $C_8$-)alkanoates, with the propanoates preferred most. The oximates are preferably used in combination with aluminium, gallium, neodymium, ruthenium, magnesium, hafnium, zirconium, indium, germanium, titanium, manganese, nickel and/or tin. The indium precursor is preferably a indium(III) trisoximato complex. The gallium complex is preferable a gallium(III) trisoximato complex.

A general structure of a preferred hydroxamato ligand as referred to above and below is of the following formula B:

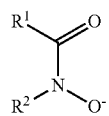

B wherein $R^1$ is selected from $C_1$ to $C_{15}$ alkyl, phenyl or benzyl, preferably $C_1$ to $C_6$ alkyl, including methyl, ethyl, n-propyl, i-propyl, tert-butyl, and $R^2$ is selected from H, $C_1$ to $C_6$ alkyls, preferably H, $CH_3$ or $CH_2CH_3$. The hydroxamato ligand usually is a chelate ligand with one negative charge. As a chelate ligand it bonds to the metal via the two oxygen atoms.

Metal hydroxamato complexes are of the general formula $(R^1C(=O)NR^2O)_m M_n X_o Y_p$, where $R^1$ represents either a $C_1$ to $C_{10}$ aliphatic, olefinic, or aromatic group, $R^2$ represents either a H atom, a $C_1$ to $C_{10}$ alkyl chain, or a phenyl group, m is a number between n and 4n. Especially preferred are $R^1$=methyl, ethyl, n-propyl, i-propyl and tert-bytyl, and $R_2$=H, methyl and ethyl. M represents either an element of group 2, 13 or 14 PSE, or a transition metal, n is at least one (e.g. 1, 2, 3, preferably 1), X represents a negatively charged ligand, such as a hydroxide or alkoxide group, or a terminal or bridging oxo ligand, o is a number between 0 and 2n, Y represents an uncharged donor ligand, such as water, an alcohol, a primary, secondary or tertiary aliphatic amine or pyridine, and p is a number between 0 and 2n. Preferred metal hydroxamates are of formula $(R^1C(=O)NR^2O)_m MY_p$. The metal in combination with hydroxamato ligands as precursors is preferably selected from aluminium, gallium, cadmium, copper, germanium, neodymium, ruthenium, magnesium, hafnium, indium, silver, tin, zirconium and zinc, preferably copper, indium, gallium, indium, zinc, aluminium, germanium, or tin After deposition the process according to the invention comprises the processing of the deposited precursor composition, which results in the formation of an oxide semiconductor. Said processing includes the decomposition of the metal-ligand complexes. Where the precursor was deposited by a mode of printing, the resulting metal oxide layer is referred to as a printed layer of metal oxide.

The preferred mode for decomposition of said metal oximate and hydroxamato complexes (herein "the precursors") is by heating, including baking, micro-waving and thermal radiation. The precursors are preferably converted into the respective binary metal oxides $M_xO_y$ by thermal treatment between 150 and 600° C. in ambient or inert atmosphere, and hence are versatile single source precursors for the deposition of metal oxide thin films. Preferably heating is conducted in the presence of oxygen. The preferred temperatures are 200° C. and above, more preferably 240° C. and above. The end product after decomposition contains very low amounts of impurity elements like carbon and nitrogen (<1%). Decomposition of the precursors may also be achieved by UV light, preferably from a high power light source.

The precursor may include any elements of Group IIA/B (IUPAC: 2, 12), Group IIIB (IUPAC:13), Group IVA/B (IUPAC: 4, 14) or any of the transition metals Cu, Ni, Mn, Cr and Ti in the form of an organometallic complex with at least one ligand from the class of oximates or hydroxamates. Preferred elements in these groups are Mg, Zn, Al, Ga, In, and Sn. Especially preferred elements are zinc, indium, tin and gallium. In the case of zinc, indium, and gallium, the preferred ligands from the oximate class include 2-(methoxyimino)alkanoate, 2-(ethoxyimino)alkanoate, or 2-(hydroxyimino)-alkanoate. From the hydroxamate class, preferred ligands are pivalohydroxamate ($R^1$=tert-butyl, $R_2$=H), isobutyrohydroxamate ($R^1$=i-propyl, $R_2$=H) or N-methylacetohydroxamato ($R^1$=methyl, $R_2$=methyl).

In a preferred embodiment, the precursor or precursors are composed into a printable ink or printing paste for application in UV photodetectors. The precursor is preferably soluble in the liquid carrier, or can be finely dispersed. Printability is defined as the capability to be processed in the liquid phase by a printing process. Rheological properties like viscosity and surface tension are usually adjusted to the required values for a specific printing mode. Such behaviour is achieved by e.g. suitable additives like viscosity modifiers and surfactants according to knowledge of prior art.

The precursor solution can be spin coated, sprayed, ink-jet printed, dip coated, doctor bladed, gravure coated, slit coated or drop coated on the substrate. Suitable substrates include for example glass (including quartz glass), metal foil or plastic. The precursor solution can be deposited on a pre-heated substrate to decompose the precursor directly in the process of depositing to form the metal oxide layers. This can be followed by further annealing steps to improve the electronic properties and crystallinity of the absorber layer. Another method to process the absorber layer is to deposit the precursor solution onto a substrate held at room temperature. This step is followed by annealing the films at the decomposition temperature of the precursors to convert the precursor films to the corresponding metal oxide or mixed metal oxide.

The absorber layers of the UV detector made according to the invention preferably have a crystalline structure, more preferably with a polycrystalline structure, having monocrystalline domains in the range of 1 nm to 200 nm. The thickness of the absorber layer is typically in the range of 80 to 250 nm.

Electrodes are provided in contact with the absorber layer, typically on top of the absorber layer. Methods for deposition of metal lines are known to one skilled in the art like sputtering or printing. The electrodes can be made in the form of parallel lines, interdigital grids (comb electrodes) or other shapes. The optimal electrode gap varies with the photoconductor and application. Preferred electrode materials are selected from metals and other conductors (e.g. conducting oxides) which can be easily deposited like gold, silver, copper and any printable materials.

Additional layers may be introduced below or above the active semiconducting oxide layer. For example additional materials to optimize the Shottky barrier between the semiconductor and the metal electrode may be introduced during or after the inventive process. A buffer layer may be deposited between the substrate and the semiconducting oxide layer.

The examples below shall illustrate the invention without limiting it. The skilled person will be able to recognize practical details of the invention not explicitly mentioned in the description, to generalize those details by general knowledge of the art and to apply them as solution to any special problem or task in connection with the technical matter of this invention.

EXAMPLES

Example 1

Formation of a UV Photodetector with Indium Zinc Oxide (IZO) Active Layer Formed by Spin-coating an Ink Containing Indium and Zinc Oximates In a glass vial, 48.0 mg of zinc bis(2-methoxyiminopropanoate) was dissolved in 3 ml of methoxypropanol. In a separate vial, 125.5 mg of indium tris(2-methoxyiminopropanoate) was dissolved in 3 ml of methoxypropanol. The solutions were sonicated briefly until clear. 0.5 ml of each solution was combined in a new glass vial to achieve a 3 wt % solution of oximates with In:Zn in a 5:2 ratio.

The ink was spin coated onto clean quartz slides (25 mm×25 mm) using 50 µL of ink per layer and a rotational speed of 2000 rpm. After each layer, the film was annealed at 250° C. for 4 minutes to yield the semiconductor material containing indium zinc oxide (IZO). The coating procedure is repeated until seven layers are formed. The UV absorbance was seen to increase with film thickness.

To test the photoresponse of the material, two gold pads were sputtered on the substrate to a final thickness of approximately 20 nm. A 3.3 mm linear mask was used to form the active area. Accordingly, the active area between the electrodes was 3.3 mm broad and 25 mm in length. Following deposition, the device was tested for an IV response using four different light conditions: dark, a 6 W 365 nm light source, a 6 W 302 nm light source, and a 6 W 254 nm light source (hand-held fluorescent tube, VWR). The distance to the lamp was about 13 cm.

Figure 3:
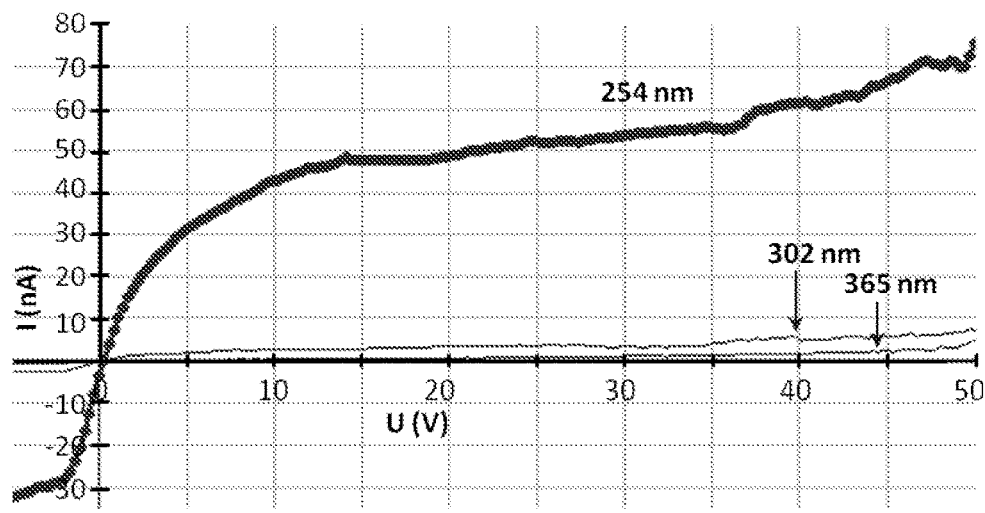
FIG. 3 depicts the current-voltage curve (IV curve) for the IZO film of Example 1 upon irradiation with light at 254 nm, 302 nm, and 365 nm and in darkness. The curve for dark condition overlaps with the baseline at 0 nA.

FIG. 3 shows the IV response of the IZO film upon irradiation with light at 254 nm/302 nm/365 nm compared to the IV curve in the dark state. The detector shows a good responsiveness in the deeper UV (254 nm), but no response at lower energies or in darkness. The sensitivity of the UV detector hat a clear cut-off between 254 nm and 301 nm in favour of shorter wavelengths.

Example 2

Formation of a UV Photodetector with Gallium Oxide ($Ga_2O_3$) Active Layer Formed by Spin-coating a Ga-Oximate Ink In a glass vial, 282 mg of gallium tris(2-methoxyiminopropanoate) was dissolved in 3.6 ml of methoxyethanol to achieve a 4 wt % solution of the oximate. The mixture was sonicated briefly until clear.

The ink was spin coated onto clean quartz slides using 50 µl of ink per layer and a speed of 2000 rpm. After each layer, the film was annealed at 250° C. for 4 minutes to yield the semiconductor material containing gallium(III) oxide. The UV absorbance was observed to increase with film thickness, i.e. the number of coating steps.

Figure 1:
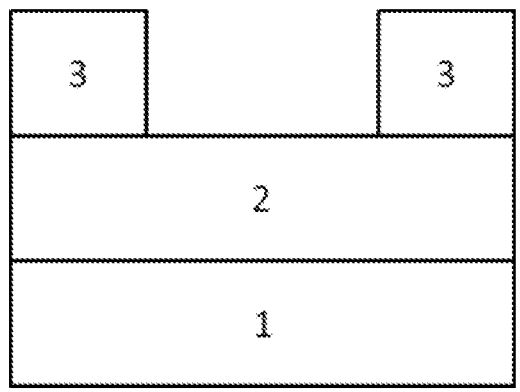
FIG. 1 illustrates a photodetector device comprising a substrate (1) from e.g. quartz, a layer of photoconductor (2) placed on the substrate (1), and two electrodes (3) connected to the photoconductor (2).
Figure 2:
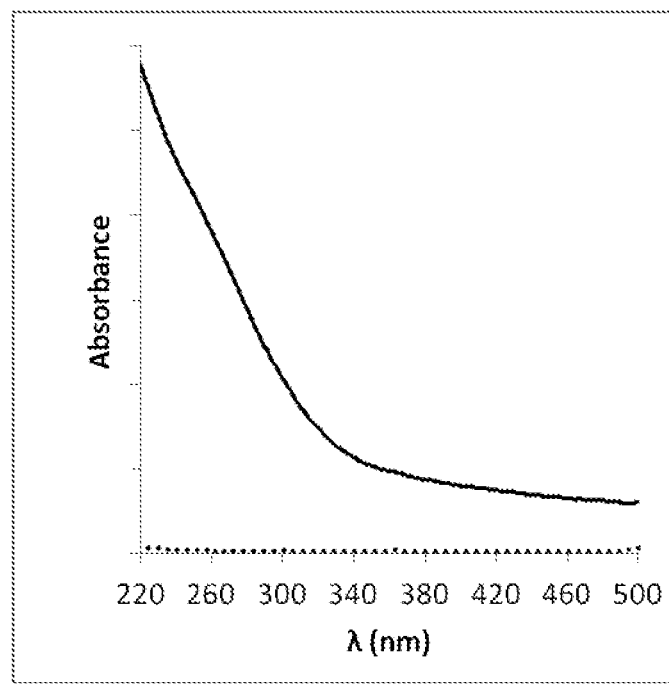
FIG. 2 depicts the absorbance spectrum of IZO films of Example 1 after annealing at 250° C. The continuous line indicates the absorbance of a layer consisting of 7 layers, and the baseline (dotted) is adjusted to the quartz substrate before coating.

FIG. 1 depicts the absorbance spectrum of $Ga_2O_3$ films after annealing at 250° C. as a function of film thickness. The quartz substrate was used as a baseline.

To test the photoresponse of the material, two gold pads were sputtered on the substrate to a final thickness of approximately 20 nm. A 3.3 mm linear mask was used to form the active area (3.3 mm×25 mm). Following deposition, the devices were tested for an IV response in the dark and under the illumination of a 6 W 254 nm light source.

Figure 4:
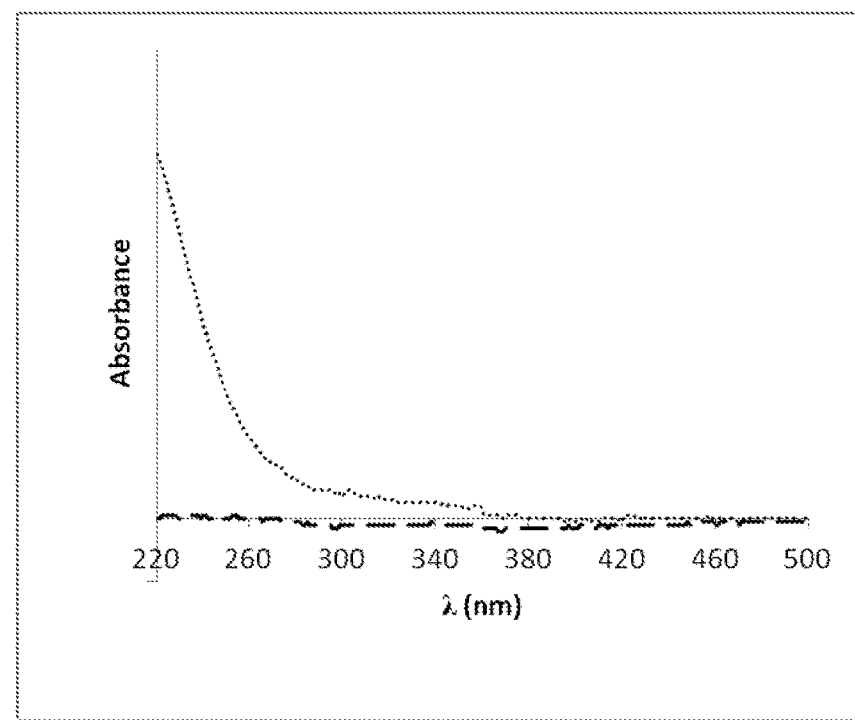
FIG. 4 depicts the absorbance spectrum of $Ga_2O_3$ films of Example 2 after annealing at 250° C. The dotted line indicates the absorbance of 6 layers, and the dashed line is the baseline adjusted to the quartz substrate before coating.
Figure 5:
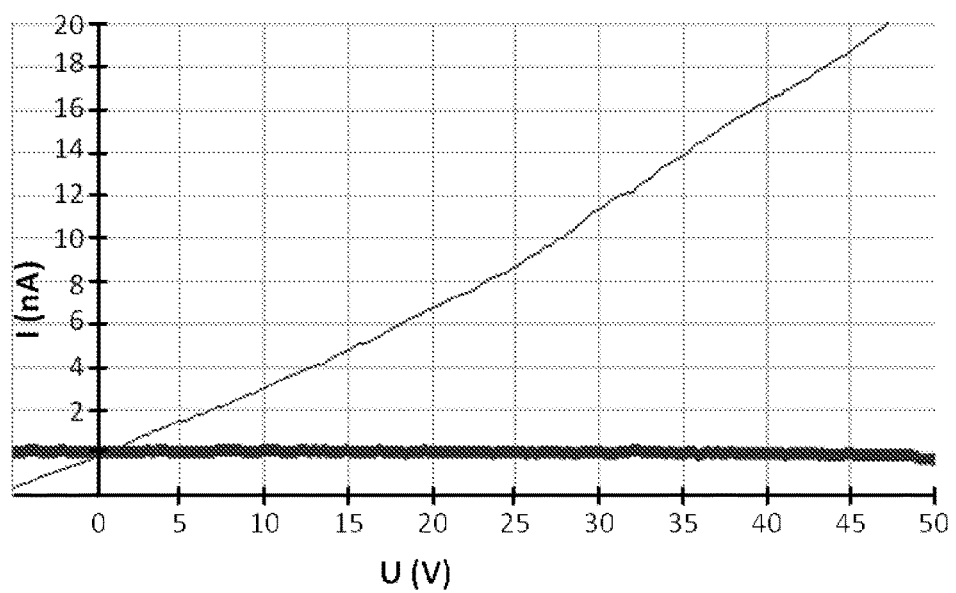
FIG. 5 depicts the current-voltage curve (IV curve) for the $Ga_2O_3$ film of Example 2 upon irradiation with light at 254 nm (ascending curve) and in darkness (overlaps with baseline at 0 nA).

In FIG. 4 is depicted the IV response of the $Ga_2O_3$ film upon irradiation at 254 nm compared to the IV curve in the dark state.

Example 3

Formation of a UV Photodetector with Gallium Oxide ($Ga_2O_3$) Active Layer Formed by Spin-coating a Ga-Hydroxamate Ink In a glass vial, 144 mg of gallium tris(N-methyl-acetohydroxamate) was dissolved in 3.6 ml of methoxyethanol to achieve a 4 wt % solution of the hydroxamate. The solutions was sonicated briefly until clear. The ink was spin coated onto clean quartz slides using 50 µl of ink per layer and a speed of 2000 rpm. After each layer, the film was annealed at 350° C. for 4 minutes to yield the semiconductor material containing gallium(III) oxide.

To test the photoresponse of the material, two gold pads were sputtered on the substrate to a final thickness of approximately 20 nm. A 3.3 mm linear mask was used to form the active area (3.3 mm×25 mm). Following deposition, the devices were tested for an IV response in the dark and under the illumination of a 6 W 254 nm light source.

Further combinations of the embodiments of the invention and variants of the invention are disclosed by the following claims.

The invention claimed is:

1. A method for producing a solar-blind UV photodetector, comprising
    depositing a liquid composition comprising a liquid carrier and gallium metal ions onto a substrate, where one or more of the gallium metal ions is bound to an oximate or hydroxamate ligand,
    processing the deposited composition by evaporating the liquid carrier and heating residual material at a temperature of from 240 to 600° C., resulting in a UV photodetector material which consists of $Ga_2O_3$, and
    providing electrodes to the UV photodetector material to result in a solar-blind UV photodetector.

2. The method for producing a solar-blind UV photodetector according to claim 1, wherein the processing of the deposited composition comprises heating in the presence of oxygen.

3. The method for producing a solar-blind UV photodetector according to claim 1, wherein the liquid composition comprises an oximate ligand.

4. The method for producing a solar-blind UV photodetector according to claim 1, wherein the liquid composition comprises a hydroxamate ligand.

5. A printed solar-blind UV photodetector produced by the process of claim 1, comprising a substrate,
a printed layer of UV photodetector material consisting of $Ga_2O_3$, and
a pair of electrodes connected to the layer of UV photodetector material, wherein the electrodes are configured in a manner such that incident UV light can be absorbed by the layer of UV photodetector material connected to the electrodes.

6. The method for producing a solar-blind UV photodetector according to claim 1, wherein one or more of the gallium metal ions is bound to an oximate ligand and the oximate ligand has formula A:

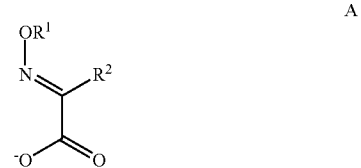

wherein $R_1$ is H, $CH_3$ or $CH_2CH_3$, and $R_2$ is H, $C_1$ to $C_6$ alkyl, phenyl or benzyl.

7. The method for producing a solar-blind UV photodetector according to claim 1, wherein one or more of the gallium metal ions is bound to a hydroxamate ligand and the hydroxamate ligand has formula B:

wherein $R^1$ is $C_1$ to $C_{15}$ alkyl, phenyl or benzyl, and $R^2$ is H, or $C_1$ to $C_6$ alkyl.

* * * * *